(12) United States Patent
Kurisu et al.

(10) Patent No.: US 6,674,313 B2
(45) Date of Patent: Jan. 6, 2004

(54) OUTPUT BUFFER CIRCUIT

(75) Inventors: Masakazu Kurisu, Tokyo (JP); Takaaki Nedachi, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/952,426

(22) Filed: Sep. 14, 2001

(65) Prior Publication Data

US 2002/0030517 A1 Mar. 14, 2002

(30) Foreign Application Priority Data

Sep. 14, 2000 (JP) ........................ 2000-280559

(51) Int. Cl.[7] .............................................. H03B 1/00
(52) U.S. Cl. ........................................ 327/108; 326/86
(58) Field of Search ............................ 327/108, 112, 327/111; 326/83, 86, 87, 109, 47

(56) References Cited

U.S. PATENT DOCUMENTS

| | | | |
|---|---|---|---|
| 4,877,978 A | * 10/1989 | Platt | 326/83 |
| 5,043,944 A | * 8/1991 | Nakamura et al. | 326/86 |
| 5,323,070 A | * 6/1994 | Ueda et al. | 326/109 |
| 5,455,524 A | * 10/1995 | Ikeya et al. | 326/47 |
| 5,864,584 A | * 1/1999 | Cao et al. | 326/86 |
| 6,326,832 B1 | * 12/2001 | Macaluso | 327/112 |
| 6,351,172 B1 | * 2/2002 | Ouyang et al. | 327/112 |

FOREIGN PATENT DOCUMENTS

| | | | |
|---|---|---|---|
| JP | 5-344026 | 12/1993 | ............ H04B/1/62 |
| JP | 7-183746 | 7/1995 | ............ H03G/9/00 |
| JP | 9-139664 | 5/1997 | ....... H03K/19/0175 |
| JP | 2781137 | 5/1998 | .......... H04N/5/922 |
| JP | 11-345054 | 12/1999 | ............ G06F/3/00 |
| JP | 2000-68816 | 3/2000 | ....... H03K/19/0175 |

* cited by examiner

*Primary Examiner*—Timothy P. Callahan
*Assistant Examiner*—Linh Nguyen
(74) *Attorney, Agent, or Firm*—Hayes Soloway P.C.

(57) ABSTRACT

An output buffer circuit having a function of accomplishing pre-emphasis, and transmitting a logic signal to a transmission line acting as a distributed parameter circuit, includes (a) a first buffer which receives a first logic signal defining a logical value of a logic signal to be transmitted to the transmission line, and drives the transmission line, and (b) a second buffer which receives a second logic signal having a predetermined logical relation with the first logic signal, and cooperates with the first buffer to drive the transmission line. The second buffer has an output impedance higher than an output impedance of the first buffer as long as attenuation in a signal in the transmission line is improved.

21 Claims, 6 Drawing Sheets

OUTPUT BUFFER CIRCUIT

BACKGROUND OF THE INVENTION

1. Field of the Invention

The invention relates to an output buffer circuit mounted on a semiconductor integrated circuit device, and converting logic data having been processed in the semiconductor integrated circuit device, into a logic signal, and outputting outwardly of the semiconductor integrated circuit device, and more particularly to such an output buffer circuit having a function of carrying out pre-emphasis in accordance with attenuation in a transmission line.

2. Description of the Related Art

Some of output buffer circuits for transmitting a logic signal to a transmission line acting as a distributed parameter circuit are designed to have a so-called pre-emphasis function by which a signal waveform is emphasized in accordance with attenuation in a signal on a transmission line. Such output buffer circuits are accomplished generally by a current-mode type circuit, that is, a circuit which deals with a signal indicative of a current.

The current-mode type circuit is accompanied with a problem that its structure causes the circuit to work not so well at a relatively low voltage.

However, as a technique for fabricating a semiconductor integrated circuit in a smaller scale has been developed, a semiconductor integrated circuit can work with lower power consumption because of reduction in an operational voltage. As a result, a semiconductor integrated circuit is presently requested to operate at a high rate at a lower voltage.

Japanese Unexamined Patent Publication No. 2000-68816 which is based on German patent application No. 19825258.7 filed on Jun. 5, 1998, for instance, has suggested an output buffer circuit to meet such a request.

Figure 1:
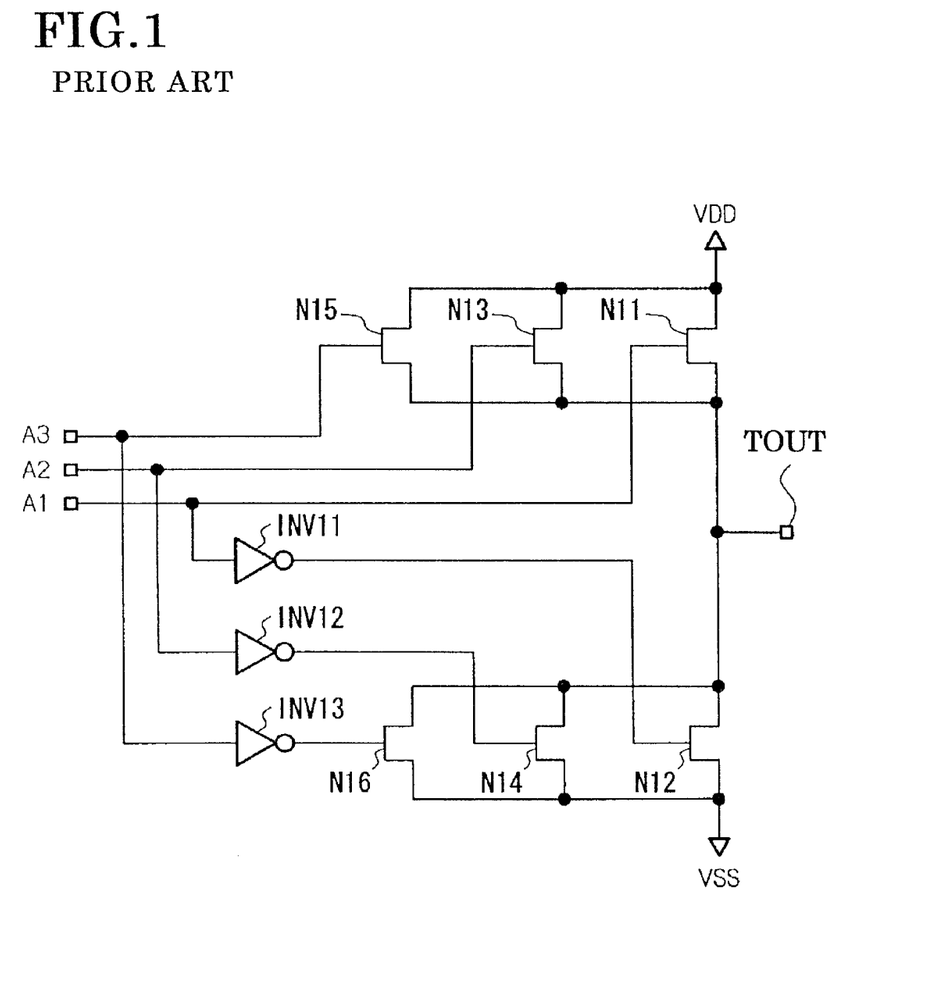
FIG. 1 is a circuit diagram of a conventional output buffer circuit.

The output buffer circuit suggested in the Publication is comprised of an output stage illustrated in FIG. 1, and a control circuit (not illustrated). The output stage illustrated in FIG. 1 is comprised of n-channel field effect transistors N11, N13 and N15 each electrically connected between a higher voltage source VDD and an output terminal TOUT, n-channel field effect transistors N12, N14 and N16 each electrically connected between a lower voltage source VSS and the output terminal TOUT, and inverters INV 11, INV 12 and INV 13. The n-channel field effect transistors N11, N13 and N15 define a first impedance circuit, and the n-channel field effect transistors N12, N14 and N16 define a second impedance circuit.

The inverters INV 11, INV 12 and INV 13 receive control signals A1, A2 and A3, and inverted those control signals A1, A2 and A3. The control signals A1, A2 and A3 are applied to gate electrodes of the n-channel field effect transistors N11, N13 and N15, and the controls signals A1, A2 and A3 having been inverted by the inverters INV 11, INV 12 and INV 13 are applied to gate electrodes of the n-channel field effect transistors N12, N14 and N16. The n-channel field effect transistors N11, N13, N15, N12, N14 and N16 in the first and second impedance circuits are turned on or off such that an impedance ratio of an impedance of the first impedance circuit to an impedance of the second impedance circuit is equal to any one of at least three different values and that a sum of conductances of the first and second impedance circuits is not dependent on the impedance ratio. This ensures that an output impedance is kept almost equal to a predetermined value regardless of pre-emphasis.

Though the above-mentioned output buffer circuit can operate at a lower voltage than a voltage at which a general current-mode type circuit can operate, the output buffer circuit has to include the control circuit for controlling on/off of the field effect transistors constituting the first and second impedance circuits. The control circuit transmits the control signals A1, A2 and A3 required for a pre-emphasis step, by conducting logic operations such as logical product (AND) and logical sum (OR) through the use of data to be transmitted. As a result, the output buffer circuit unavoidably has much propagation delay time from an input to an output. An output signal is influenced by voltage source noises and voltage fluctuation during the propagation delay time, and thus, jitter is increased, resulting in that the output buffer circuit cannot operate at a high rate.

Japanese Unexamined Patent Publication No. 11-345054 has suggested a driver circuit for transmitting signals, including an output stage driver, a previous stage driver for driving the output stage driver, and a level adjuster for adjusting an output level of the previous stage driver. The output stage driver transmits a variable-level signal in accordance with the output level of the previous stage driver.

Japanese Unexamined Patent Publication No. 5-344026 has suggested a pre-emphasis circuit including an amplifying circuit equipped with a negative feed-back circuit which provided a smaller feed-back in response to a higher frequency.

Japanese Unexamined Patent Publication No. 7-183746 has suggested (a) an emphasis/de-emphasis circuit including an operational amplifier in which a de-emphasized signal input is input to a non-inverted input terminal, (b) a switching circuit having an input electrically connected to an output terminal of the operational amplifier, another input electrically connected to an emphasis input, and an output electrically connected to a de-emphasis signal output terminal, and equalizing the input and output to each other with respect to a voltage, selecting one of the input and another input, and transmitting the selected input, and (c) an emphasis circuit having an input electrically connected to an output of the switching circuit, and an output electrically connected to both the non-inverted input terminal of the operational amplifier and an emphasis signal output terminal, and conducting an emphasis step to signals received through the input. By means of the switching circuit, an emphasis step or a deemphasis step is carried out.

Japanese Unexamined Patent Publication No. 9-139664, which is based on United Kingdom patent application No. 9518183.0 filed on Sep. 6, 1995, has suggested an integrated circuit including a driver circuit which transmits data signals to communication channels. The driver circuit is comprised of a first output buffer including a plurality of pull-up transistors electrically connected to a first output conductor through pull-up resistors, and a plurality of pull-down transistors electrically connected to the first output conductor through pull-down resistors, a plurality of delay circuits each transmitting a delay data signal to each of control terminals of the pull-up and pull-down transistors, and control circuits operating one of the delay circuits selected in accordance with a data input signal.

Japanese Patent No. 2781137 (Japanese Unexamined Patent Publication No. 6-350961) has suggested a digital non-linear pre-emphasis circuit including a first filter which varies a gain in an input digital signal in accordance with an amplitude of a high frequency band of the input digital signal, and transmits a signal having the varied gain, a second filter which varies a band at which the signal output from the first filter can pass, in accordance with an amplitude of the signal output from the first filter, and a mixer which mixes the input digital signal with a signal output from the second filter, and transmits a pre-emphasized signal in which a high frequency band of the input signal is emphasized.

SUMMARY OF THE INVENTION

In view of the above-mentioned problems in the conventional output buffer circuit, it is an object of the present invention to provide an output buffer circuit which is capable of operating at a relatively low voltage in spite of having a function of pre-emphasis, and which has a shortened propagation delay time from an input to an output thereof.

There is provided an output buffer circuit having a function of accomplishing pre-emphasis, and transmitting a logic signal to a transmission line acting as a distributed parameter circuit, including (a) a first buffer which receives a first logic signal defining a logical value of a logic signal to be transmitted to the transmission line, and drives the transmission line, and (b) a second buffer which receives a second logic signal having a predetermined logical relation with the first logic signal, and cooperates with the first buffer to drive the transmission line, the second buffer having an output impedance higher than an output impedance of the first buffer as long as attenuation in a signal in the transmission line is improved.

It is preferable that the second buffer is comprised of one or more tri-state type buffer(s) which is (are) activated or inactivated in accordance with whether a pre-emphasis step is to be carried out or not.

For instance, the first buffer may be comprised of (a1) a first p-channel field effect transistor having a current path between a higher voltage source and an output terminal, and having a gate electrode electrically connected to a first input terminal, and (a2) a first n-channel field effect transistor having a current path between a lower voltage source and the output terminal, and having a gate electrode electrically connected to the first input terminal, the second buffer may be comprised of (b1) a second p-channel field effect transistor having a current path between the higher voltage source and the output terminal, and having a gate electrode electrically connected to a second input terminal, and (b2) a second n-channel field effect transistor having a current path between the lower voltage source and the output terminal, and having a gate electrode electrically connected to the second input terminal, the first p-channel field effect transistor may have a driving capacity higher than a driving capacity of the second n-channel field effect transistor, and the first n-channel field effect transistor may have a driving capacity higher than a driving capacity of the second p-channel field effect transistor.

It is preferable that the second logic signal has a logical value different from a logical value of a logic signal transmitted from the first buffer at latest when the first logic signal is transited.

It is preferable that the transmission line is terminated with a terminated resistor electrically connected to a terminating voltage source.

It is preferable that the transmission line is terminated with a first terminated resistor electrically connected to a higher voltage source, and a second terminated resistor electrically connected to a lower voltage source.

It is preferable that an output impedance of the first buffer is matched to a characteristic impedance of the transmission line.

It is preferable that the second buffer is activated when a logic signal in the transmission line is attenuated in a higher degree and hence a pre-emphasis step is to be carried out, and is inactivated when the logic signal is attenuated in a lower degree and hence a pre-emphasis step is not to be carried out.

It is preferable that the second buffer is inactivated while a test is being conducted.

There is further provided an output buffer circuit having a function of accomplishing pre-emphasis, and transmitting a logic signal to a transmission line acting as a distributed parameter circuit, including (a) a first buffer which receives a first logic signal defining a logical value of a logic signal to be transmitted to the transmission line, and drives the transmission line, and (b) a second buffer which receives a second logic signal having a predetermined logical relation with the first logic signal, and cooperates with the first buffer to drive the transmission line, wherein the second buffer has an output impedance higher than an output impedance of the first buffer as long as attenuation in a signal in the transmission line is improved, the first buffer is comprised of (a1) a first p-channel field effect transistor having a current path between a higher voltage source and an output terminal, and having a gate electrode electrically connected to a first input terminal, and (a2) a first n-channel field effect transistor having a current path between a lower voltage source and the output terminal, and having a gate electrode electrically connected to the first input terminal, the second buffer is comprised of a tri-state type buffer including (b1) a second p-channel field effect transistor having a current path between the higher voltage source and the output terminal, and having a gate electrode electrically connected to a second input terminal, (b2) a second n-channel field effect transistor having a current path between the lower voltage source and the output terminal, and having a gate electrode electrically connected to the second input terminal, (b3) a third p-channel field effect transistor electrically connected in series with the second p-channel field effect transistor, and turned on or off in accordance with whether a pre-emphasis step is to be carried out or not, and (b4) a third n-channel field effect transistor electrically connected in series with the second n-channel field effect transistor, and turned on or off simultaneously with the third p-channel field effect transistor, the first p-channel field effect transistor having a driving capacity higher than a sum of driving capacities of the second and third n-channel field effect transistors, and the first n-channel field effect transistor having a driving capacity higher than a sum of driving capacities of the second and third p-channel field effect transistors.

There is still further provided an output buffer circuit having a function of accomplishing pre-emphasis, and transmitting a logic signal to a transmission line acting as a distributed parameter circuit, including (a) a first buffer which receives a first logic signal defining a logical value of a logic signal to be transmitted to the transmission line, and drives the transmission line, and (b) a second buffer which receives a second logic signal having a predetermined logical relation with the first logic signal, and cooperates with the first buffer to drive the transmission line, wherein the second buffer has an output impedance higher than an output impedance of the first buffer as long as attenuation in a signal in the transmission line is improved, the first buffer is comprised of (a1) a first p-channel field effect transistor having a current path between a higher voltage source and an output terminal, and having a gate electrode electrically connected to a first input terminal, and (a2) a first n-channel field effect transistor having a current path between a lower voltage source and the output terminal, and having a gate electrode electrically connected to the first input terminal, the second buffer is comprised of first to N-th tri-state type buffers each including (b1) a second p-channel field effect transistor having a current path between the higher voltage source and the output terminal, and having a gate electrode electrically connected to a second input terminal, (b2) a second n-channel field effect transistor having a current path between the lower voltage source and the output terminal, and having a gate electrode electrically connected to the second input terminal, (b3) a third p-channel field effect transistor electrically connected in series with the second p-channel field effect transistor, and turned on or off in accordance with whether a pre-emphasis step is to be carried out or not, and (b4) a third n-channel field effect transistor electrically connected in series with the second n-channel field effect transistor, and turned on or off simultaneously with the third p-channel field effect transistor, wherein N is an integer equal to or greater than 2, the first p-channel field effect transistor has a driving capacity higher than a sum of driving capacities of the second and third n-channel field effect transistors in the first to N-th tri-state type buffers, and the first n-channel field effect transistor has a driving capacity higher than a sum of driving capacities of the second and third p-channel field effect transistors in the first to N-th tri-state type buffers.

It is preferable that a M-th tri-state type buffer has a driving capacity equal to about a half of a driving capacity of a (M−1)-th tri-state type buffer, wherein M is an integer equal to or smaller than N.

It is preferable that the first to N-th tri-state type buffers are activated or inactivated in accordance with a binary code indicating pre-emphasis.

It is preferable that the first to N-th tri-state type buffers are activated or inactivated in accordance with attenuation of the transmission line.

It is preferable that the second buffer is activated such that pre-emphasis is minimized in a test.

Hereinbelow is explained an operation of the output buffer circuit in accordance with the present invention.

The output buffer circuit receives a first logic signal through a first input terminal which first logic signal corresponds to a signal series to be transmitted, and further receives a second logic signal through a second input terminal which second logic signal has a predetermined logical relation with the first logic signal. For instance, the second logic signal may be comprised of a signal series obtained by delaying the first logic signal to be transmitted, by one bit and inverting the same. The second buffer cooperates with the first buffer to drive a transmission line.

For instance, when the first and second logic signals have the same logical value, the first and second buffers transmit logic signals having the same logical value. Since an output impedance of the second buffer is designed so as to improve attenuation in a signal on the transmission line, the output impedance of the output buffer circuit is apparently reduced, that is, a driving capacity of the output buffer circuit is enhanced, resulting in that the output buffer circuit transmits a logic signal having an emphasized voltage (for instance, Voh 1 and Vol 1 illustrated in FIG. 3).

For another instance, when the first and second signals have different logical values from each other, the second buffer transmits a logic signal having a logical value opposite to a logical value of a logic signal to be transmitted from the first buffer. Since an output impedance of the second buffer is set higher than an output impedance of the first buffer, a logical value of a logic signal transmitted from the first buffer is kept as it is. Thus, an output impedance of the output buffer circuit is apparently increased, that is, a driving capacity of the output buffer circuit is apparently reduced, resulting in that the output buffer circuit transmits a logic signal having a de-emphasized voltage (for instance, Voh 2 and Vol 2 illustrated in FIG. 3).

As mentioned above, if a logical value of the first logic signal to be transmitted varies, a waveform of a logic signal to be transmitted is emphasized, whereas if a logical value of the first logic signal does not vary, or is kept as it is, the waveform is not emphasized, or is de-emphasized. This results in that a voltage of a logic signal to be transmitted to a transmission line becomes close to a logic threshold voltage (VTT) in preparation for next variance in a logic signal.

Accordingly, the present invention provides an advantage that high frequency components in a waveform of the first logic signal to be transmitted are reinforced, and an improvement is obtained in so-called eye pattern in a waveform of a signal received after having passed a transmission line with high loss, that is, a long or thin transmission line, such as a cable or wiring of a plent substrate. Hence, the present invention makes it possible to transmit a signal at a higher rate through a smaller-diameter cable by a longer distance than an output buffer circuit having no pre-emphasis function.

In addition, since the output buffer circuit in accordance with the present invention is designed to have a CMOS type circuit structure, the output buffer can operate at a lower source voltage than a voltage at which a current-mode type circuit operates.

Furthermore, since it is not necessary to conduct logical operation such as logical product (AND) and logical sum (OR) to received signals such as the first and second logic signals when a pre-emphasis step is to be carried out, it would be possible to shorten propagation delay time from an input section to an output section, ensuring an operation at a higher rate.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

FIG. 1 is a circuit diagram of the output buffer circuit in accordance with the first embodiment.

The output buffer circuit has a pre-emphasis function, and transmits a logic signal to a transmission line L acting as a distributed parameter circuit. The output buffer circuit is comprised of a current bit input terminal TA, an inverted pre-bit input terminal TB, a first input terminal TIN 1, a second input terminal TIN 2, a first inverter INV 1, a second inverter INV 2, a first buffer B1, a second buffer B2, an output terminal TOUT, and a terminating resistor Rt electrically connected to a receiver terminal TRV. The transmission line L is electrically connected at its leading end to the output terminal TOUT, and at its trailing end to the receiver terminal TRV.

The first inverter INV 1 receives a current bit signal S01 having a logical value which is the same as a logical value of a logic signal to be transmitted to the transmission line L, through the current bit input terminal TA, inverts the current bit signal S01, and outputs the thus inverted current bit signal as a first logic signal S1. The first logic signal S1 defines a logical value of a logic signal to be transmitted to the transmission line L. The first logic signal Si is input into the first buffer B1 through the first input terminal TIN 1. On receipt of the first logic signal S1, the first buffer B1 drives the transmission line L.

The second buffer B2 receives an inverted pre-bit signal designating a pre-emphasis step or a de-emphasis step to be carried out, through the inverted pre-bit input terminal TB, inverts the inverted pre-bit signal, and outputs the resultant signal as a second logic signal S2. The inverted pre-bit signal and the above-mentioned current bit signal are in advance produced such that they have such logic relationship therebetween that a pre-emphasis or de-emphasis step is carried out to a waveform of a logic signal to be transmitted to the transmission line L. Hence, the inverted pre-bit signal and the current bit signal define predetermined logic relation between the first and second logic signals S1 and S2, that is, logic relation determining whether a pre-emphasis step or a de-emphasis step is to be carried out to a waveform of a logic signal to be transmitted to the transmission line L.

In the first embodiment, the second logic signal S2 has a logical value different from or opposite to a logical value of a logic signal transmitted from the first buffer B1 immediately before the first logic signal S1 is transited, at latest when the first logic signal S1 is transited.

The second logic signal S2 is input into the second buffer B2 through the second input terminal TIN 2. On receipt of the second logic signal S2 having the above-mentioned logic relation with the first logic signal S1, the second buffer B2 cooperates with the first buffer B1 to drive the transmission line L. An output impedance of the second buffer B2 is set higher than an output impedance of the first buffer B13 as long as attenuation in a signal on the transmission line L is improved.

Hereinbelow is explained a structure of the output buffer circuit in more detail.

The first buffer B1 is comprised of a CMOS inverter including a first p-channel field effect transistor P1 and a first n-channel field effect transistor N1. The first p-channel field effect transistor P1 has a current path between a higher voltage source VDD and the output terminal TOUT, and has a gate electrode electrically connected to the first input terminal TIN 1. The first n-channel field effect transistor N1 has a current path between a lower voltage source VSS and the output terminal TOUT, and has a gate electrode electrically connected to the first input terminal TIN 1.

The second buffer B2 is comprised of a CMOS inverter including a second p-channel field effect transistor P2 and a second n-channel field effect transistor N2. The second p-channel field effect transistor P2 has a current path between the higher voltage source VDD and the output terminal TOUT, and has a gate electrode electrically connected to the second input terminal TIN 2. The second n-channel field effect transistor N2 has a current path between the lower voltage source VSS and the output terminal TOUT, and has a gate electrode electrically connected to the second input terminal TIN 2.

The first p-channel field effect transistor P1 is designed to have a driving capacity higher than a driving capacity of the second n-channel field effect transistor N2, and the first n-channel field effect transistor N1 is designed to have a driving capacity higher than a driving capacity of the second p-channel field effect transistor P2. Herein, a driving capacity is defined as how small its on-resistance is, for instance.

In the first buffer B1, the first p-channel field effect transistor P1 has a source electrode electrically connected to the higher voltage source VDD, and a drain electrode electrically connected to the output terminal TOUT, and the first n-channel field effect transistor N1 has a source electrode electrically connected to the lower voltage source VSS, and a drain electrode electrically connected to the output terminal TOUT.

In the second buffer B2, the second p-channel field effect transistor P2 has a source electrode electrically connected to the higher voltage source VDD, and a drain electrode electrically connected to the output terminal TOUT, and the second n-channel field effect transistor N2 has a source electrode electrically connected to the lower voltage source VSS, and a drain electrode electrically connected to the output terminal TOUT.

Gate electrodes of the first p-channel field effect transistor P1 and the first n-channel field effect transistor N1 are electrically connected to the first input terminal TIN 1, and gate electrodes of the first p-channel second effect transistor P2 and the second n-channel field effect transistor N2 are electrically connected to the second input terminal TIN 2.

The output terminal TOUT is electrically connected to the leading end of the transmission line L. The transmission line L is electrically connected at its trailing end to the receiver terminal TRV, which is electrically connected to a terminating voltage source VTT through the terminating resistor Rt which matches with a characteristic impedance of the transmission line L. Herein, the higher voltage source VDD, the lower voltage source VSS and the terminating voltage source VTT have a relation with one another, defined as follows.

$$VDD > VTT > VSS \qquad (A)$$

A terminating voltage in the first embodiment is designed to be equal to a logical threshold value defining a boundary between logical values 0 and 1. Accordingly, a logic signal running through the transmission line L has a voltage higher than the terminating voltage VTT or voltage lower than the terminating voltage VTT in accordance with a logical value of the logic signal.

Hereinbelow is explained the operation of the output buffer circuit in accordance with the first embodiment.

Figure 3:
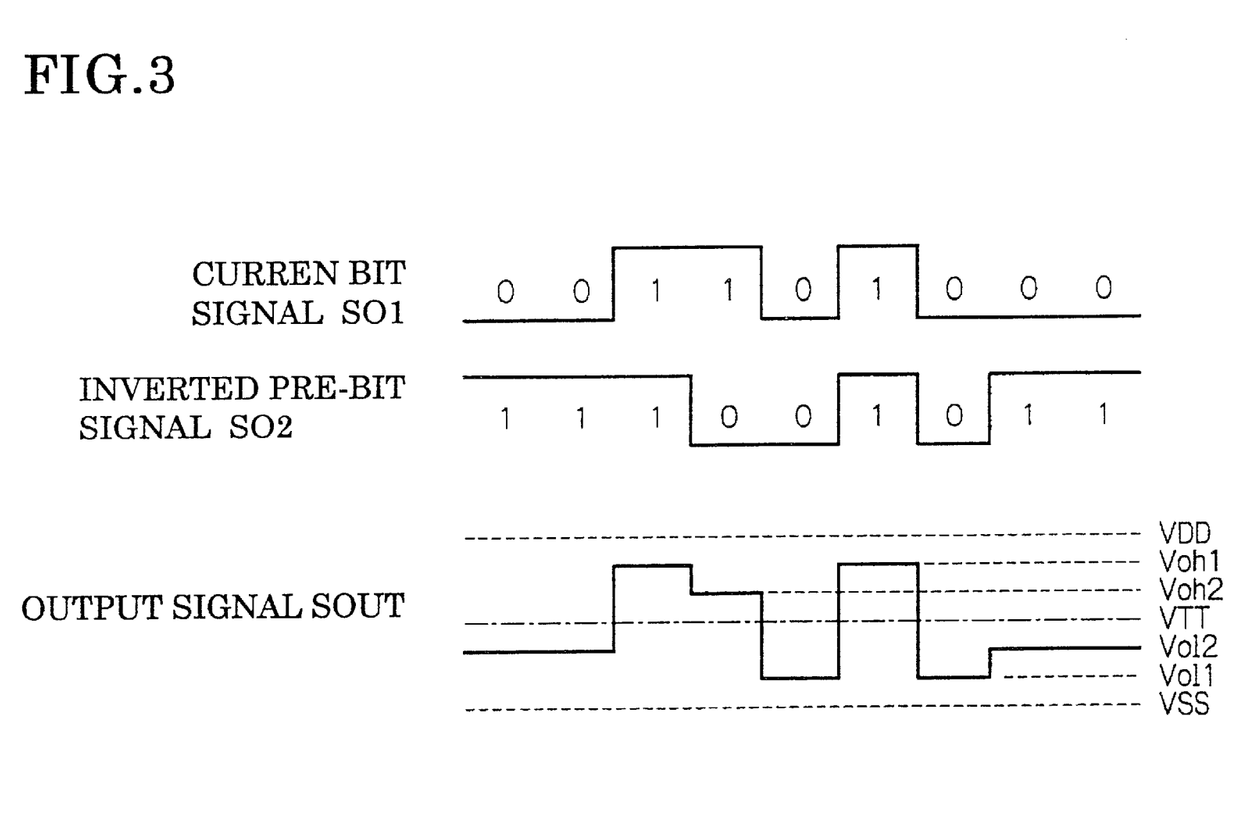
FIG. 3 shows waveforms of the signals in the output buffer circuit illustrated in FIG. 2.

First, pre-emphasis operation is explained hereinafter with reference to FIG. 3 showing waveforms of the current bit signal S01, the inverted pre-bit signal S02, and an output signal SOUT.

With reference to FIG. 3, the first buffer B1 receives a signal series "001101000" from a circuitry (not illustrated)

as the current bit signal S01, and the second buffer B2 receives a signal series "111001011" as the inverted pre-bit signal S02, which is obtained by delaying the signal series of the current bit signal by one bit, and inverting the delayed signal series.

When both the current bit signal S01 and the inverted pre-bit signal S02 have a logical value of 1, the first p-channel field effect transistor P1 and the second p-channel field effect transistor P2 are turned on, and the first n-channel field effect transistor N1 and the second n-channel field effect transistor N2 are turned off. As a result, a pre-emphasis step is carried out to a waveform of a logic signal having a logical value of 1. A high-level output voltage Voh 1 under emphasis is defined in accordance with the following equation (B), by virtue of Kirchhoff's law.

$$Voh\ 1 = VTT + (VDD - VTT)Rt/(Rt + (Rp\ 1/Rp\ 2)) \tag{B}$$

Herein, Rt indicates a terminating resistance, Rp 1 indicates on-resistance of the first p-channel field effect transistor P1, and Rp 2 indicates on-resistance of the second p-channel field effect transistor P2.

When both the current bit signal S01 and the inverted pre-bit signal S02 have a logical value of 0, the first p-channel field effect transistor P1 and the second p-channel field effect transistor P2 are turned off, and the first n-channel field effect transistor N1 and the second n-channel field effect transistor N2 are turned on. As a result, a pre-emphasis step is carried out to a waveform of a logic signal having a logical value of 0. A low-level output voltage Vol 1 under emphasis is defined in accordance with the following equation (C), by virtue of Kirchhoff's law.

$$Vol\ 1 = VTT - (VTT - VSS)Rt/(Rt + (Rn\ 1/Rn\ 2)) \tag{C}$$

Herein, Rn 1 indicates on-resistance of the first n-channel field effect transistor N1, and Rn 2 indicates on-resistance of the second n-channel field effect transistor N2.

When the current bit signal S01 has a logical value of 1 and the inverted pre-bit signal S02 has a logical value of 0, the first p-channel field effect transistor P1 and the second n-channel field effect transistor N2 are turned on, and the first n-channel field effect transistor N1 and the second p-channel field effect transistor P2 are turned off. As a result, a de-emphasis step is carried out to a waveform of a logic signal having a logical value of 1. A high-level output voltage Voh 2 under de-emphasis is defined in accordance with the following equation (D), by virtue of Kirchhoff's law.

$$Voh\ 2 = VTT + (Rn\ 2(VDD-VTT) - Rp\ 1(VTT-VSS))Rt/(Rp\ 1 \cdot Rn\ 2 + Rn\ 2 \cdot Rt + Rt \cdot Rp\ 1) \tag{D}$$

In order to ensure that the high-level output voltage Voh 2 is higher than the terminating voltage VTT as a logical threshold voltage, it is necessary for Th the first p-channel field effect transistor P1 to have a driving capacity higher than the same of the second n-channel field effect transistor N2. In other words, the following relation (E) has to be established.

$$Rp\ 1 < Rn\ 2 \tag{E}$$

When the current bit signal S01 has a logical value of 0 and the inverted pre-bit signal S02 has a logical value of 1, the first p-channel field effect transistor P1 and the second n-channel field effect transistor N2 are turned off, and the first n-channel field effect transistor N1 and the second p-channel field effect transistor P2 are turned on. As a result, a de-emphasis step is carried out to a waveform of a logic signal having a logical value of 0. A low-level output voltage Vol 2 under de-emphasis is defined in accordance with the following equation (F), by virtue of Kirchhoff's law.

$$Vol\ 2 = VTT - (Rp\ 2(VTT-VSS) - Rn\ 1(VDD-VTT))Rt/(Rn\ 1 \cdot Rp\ 2 + Rp\ 2 \cdot Rt + Rt \cdot Rn\ 1) \tag{F}$$

In order to ensure that the low-level output voltage Vol 2 is lower than the terminating voltage VTT as a logical threshold voltage, it is necessary for the first n-channel field effect transistor N1 to have a driving capacity higher than the same of the second p-channel field effect transistor P2. In other words, the following relation (G) has to be established.

$$Rn\ 1 < Rp\ 2 \tag{G}$$

Hereinbelow, there are shown examples of the above-mentioned high-level output voltages Voh 1, Voh 2 and the low-level output voltages Vol 1, Vol 2.

For instance, assuming that

VDD=1.5V,

VSS=0V,

VTT=0.75V,

Rt=50Ω,

Rp 1=50Ω,

Rn 1=50Ω,

Rp 2=100Ω, and

Rn 2=100Ω, there are obtained the following four different output voltages:

Voh 1=1.2V (pre-emphasized high-level output voltage);

Voh 2=0.9V (de-emphasized high-level output voltage);

Vol 1=0.3V (pre-emphasized low-level output voltage); and

Vol 2=0.6V (de-emphasized low-level output voltage).

As mentioned above, when a logical value of the current bit signal S01 varies to 1 from 0, the emphasis step is carried out. Specifically, the output buffer circuit transmits the high-level output voltage Voh 1 to emphasize a waveform of the logic signal having a logical value of 1.

When a logical value of the current bit signal S01 is kept equal to 1, the de-emphasis step is carried out. Specifically, the output buffer circuit transmits the high-level output voltage Voh 2 which is close to the terminating voltage VTT defining a logic threshold voltage, and waits for next variance of a logical value of the current bit signal S01, that is, waits until a logical value of the current bit signal S01 varies to 0 from 1.

When a logical value of the current bit signal S01 varies to 0 from 1, the emphasis step is carried out. Specifically, the output buffer circuit transmits the low-level output voltage Vol 1 to emphasize a waveform of the logic signal having a logical value of 0.

When a logical value of the current bit signal S01 is kept equal to 0, the de-emphasis step is carried out. Specifically, the output buffer circuit transmits the low-level output voltage Vol 2 which is close to the terminating voltage VTT defining a logic threshold voltage, and waits for next variance of a logical value of the current bit signal S01, that is, waits until a logical value of the current bit signal S01 varies to 1 from 0.

In accordance with the first embodiment, after a signal has passed through a transmission line such as a wiring formed on a plent substrate, or a cable in both of which a transmitted signal is attenuated, an improvement is made in so-called eye pattern which indicates a band at which signals can be properly received, taking fluctuation in a voltage amplitude of a received signal and fluctuation in timing of a received signal into consideration. As a result, it is possible to transmit a signal at a higher bit rate by a longer distance than an output buffer circuit having no pre-emphasis function.

In addition, since the output buffer circuit in accordance with the first embodiment is designed to have a CMOS type circuit structure, the output buffer can operate at a lower source voltage than a voltage at which a conventional current-mode type circuit operates.

Figure 2:
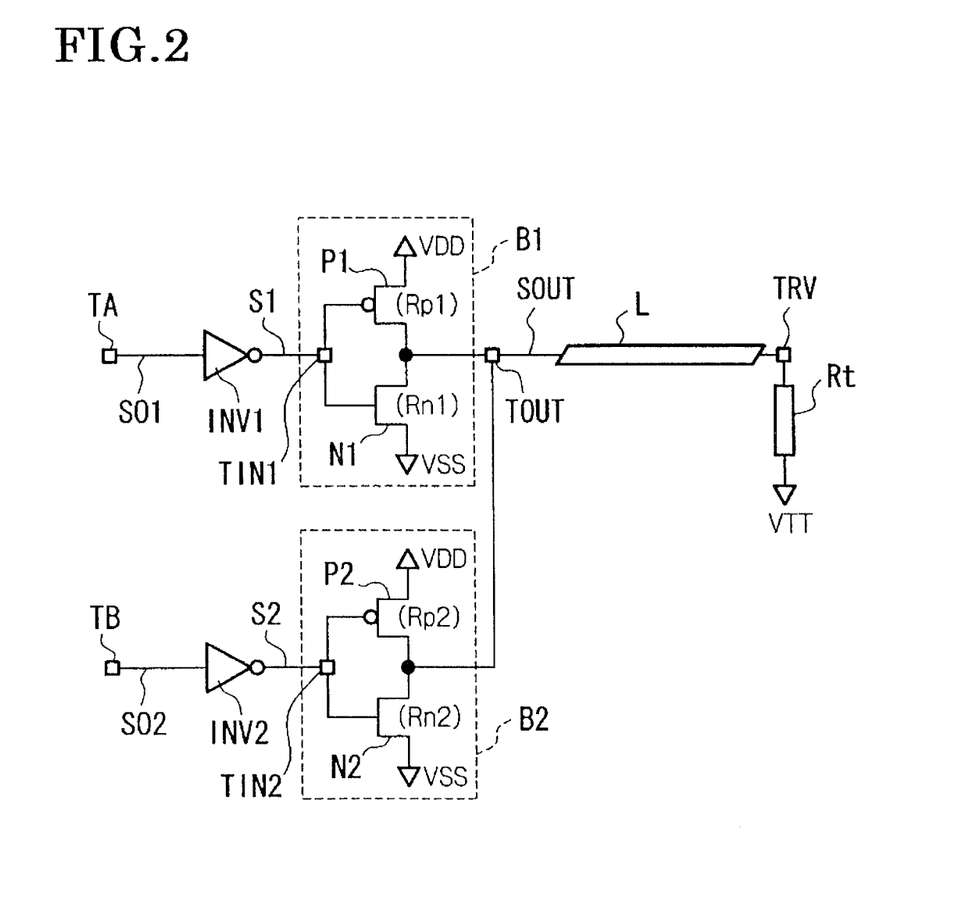
FIG. 2 is a circuit diagram of the output buffer circuit in accordance with the first embodiment of the present invention.

Furthermore, it is not necessary in the first embodiment for the output buffer circuit to have a device such as an exclusive logical sum (OR) gate in a signal line for detecting signal variance by which the emphasis function is turned on or off. Hence, the number of stages from the current bit input terminal TA to the output terminal TOUT is just two, ensuring shortened signal propagation time.

Furthermore, if both the on-resistance Rp 1 of the first p-channel field effect transistor P1 and the on-resistance Rn 1 of the first n-channel field effect transistor N1 are matched with a characteristic impedance of the transmission line L, it would be possible to suppress signal reflection which might occur at a transmitter's side.

Figure 4:
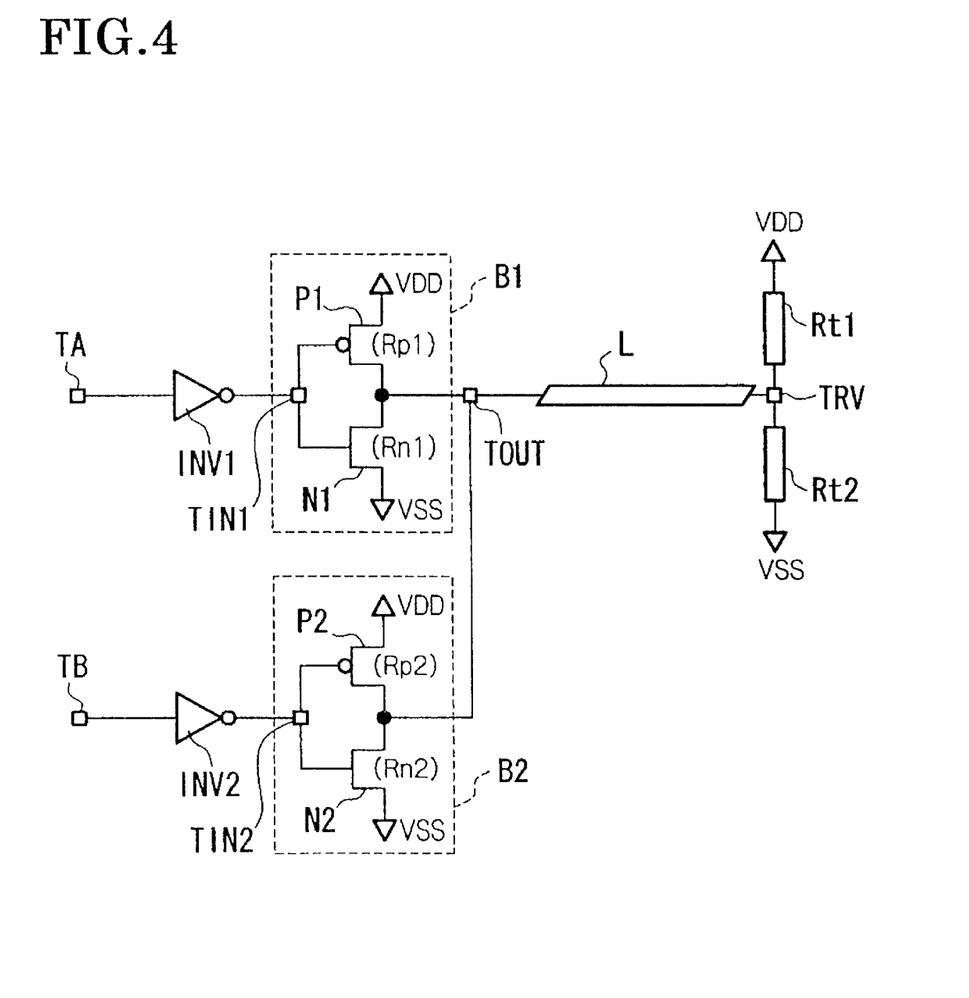
FIG. 4 is a circuit diagram of a variant of the output buffer circuit in accordance with the first embodiment.

FIG. 4 is a circuit diagram of a variant of the output buffer circuit in accordance with the first embodiment.

Though the transmission line L is terminated with the terminating voltage source VTT in the above-mentioned first embodiment, the transmission line L may be terminated in accordance with the Γvenin's theorem, as shown in FIG. 4. Specifically, a first terminating resistor Rt 1 is inserted between the higher voltage source VDD and the receiver terminal TRV, and a second terminating resistor Rt 2 is inserted between the lower voltage source VSS and the receiver terminal TRV. The first and second terminating resistors Rt 1 and RT 2 have a resistance twice greater than the characteristic impedance.

The output buffer circuit illustrated in FIG. 4 is no longer necessary to include the terminating voltage source VTT for terminating the transmission line L, and hence, the output buffer circuit can be designed to include a single voltage source.

[Second Embodiment]

Figure 5:
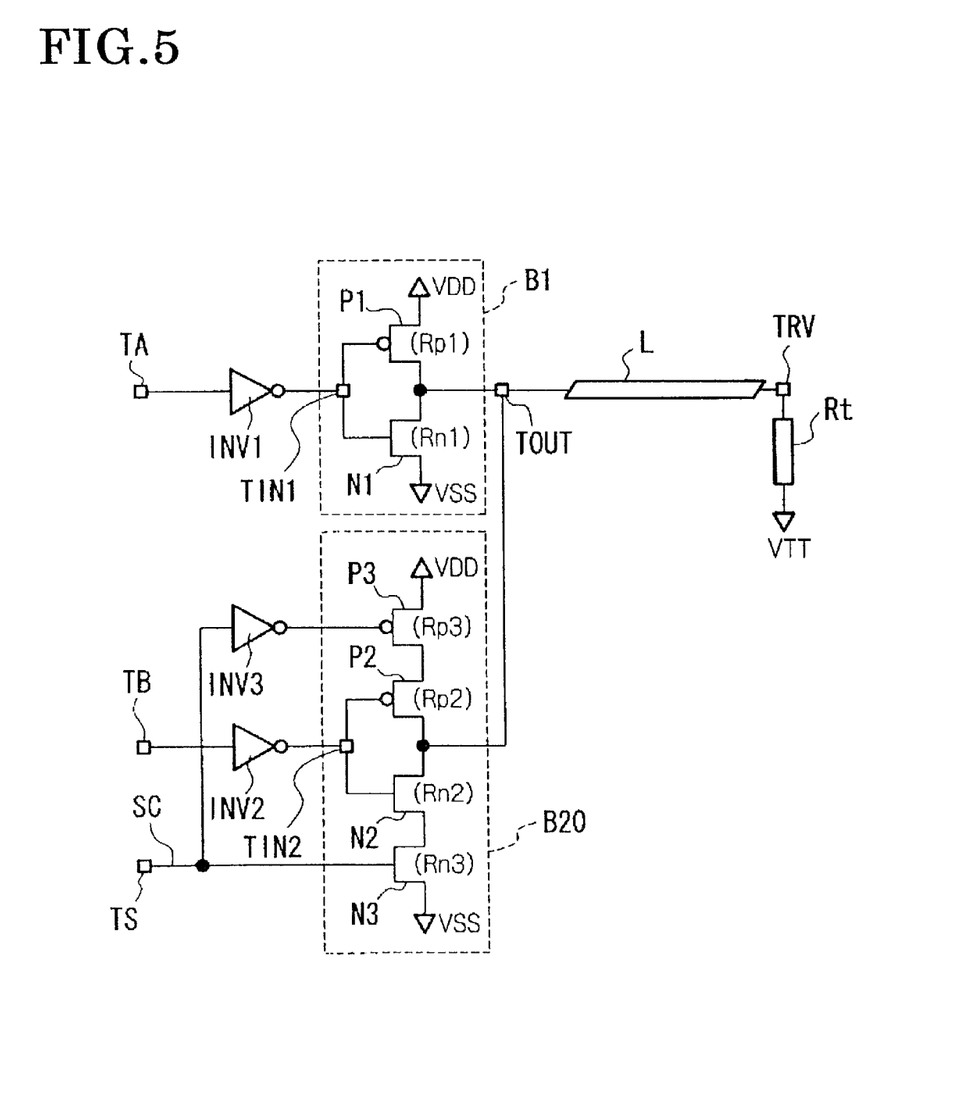
FIG. 5 is a circuit diagram of the output buffer circuit in accordance with the second embodiment of the present invention.

FIG. 5 is a circuit diagram of the output buffer circuit in accordance with the second embodiment.

The output buffer circuit in accordance with the second embodiment has not only the functions of the first embodiment, but also an additional function of controlling enabling or disabling a pre-emphasis function. In comparison with the output buffer circuit in accordance with the first embodiment, illustrated in FIG. 2, the output buffer circuit in accordance with the second embodiment, illustrated in FIG. 5, is designed to include a tri-state type buffer B20 in place of the second buffer B2, and additionally include a third inverter INV 3. The tri-state type buffer B20 is activated or inactivated in accordance with whether a pre-emphasis step is to be carried out or not. The third inverter INV 3 inverts a control signal TS in accordance with which the tri-state buffer B20 is activated or inactivated.

With reference to FIG. 5, the tri-state type buffer B20 is comprised of a second p-channel field effect transistor P2, a third p-channel field effect transistor P3, a second n-channel field effect transistor N2, and a third n-channel field effect transistor N3. These transistors are electrically connected in series to one another such that their current paths extend between the higher voltage source VDD and the lower voltage source VSS.

The second p-channel field effect transistor P2 has a current path between the higher voltage source VDD and the output terminal TOUT, and has a gate electrode electrically connected to the second input terminal TIN 2. The second n-channel field effect transistor N2 has a current path between the lower voltage source VSS and the output terminal TOUT, and has a gate electrode electrically connected to the second input terminal TIN 2. The third p-channel field effect transistor P3 has a current path between the higher voltage source VDD and the current path of the second p-channel field effect transistor P2. The third n-channel field effect transistor N3 has a current path between the lower voltage source VSS and the current path of the second n-channel field effect transistor N2.

The first p-channel field effect transistor P1 is designed to have a driving capacity higher than a driving capacity of a series circuit defined by the second n-channel field effect transistor N2 and the third n-channel field effect transistor N3, and the first n-channel field effect transistor N1 is designed to have a driving capacity higher than a driving capacity of a series circuit defined by the second p-channel field effect transistor P2 and the third p-channel field effect transistor P3.

A control signal SC input through the control input terminal TS is inverted in the third inverter INV 3, and the thus inverted control signal is input into a gate electrode of the third p-channel field effect transistor P3. The control signal SC is input into a gate electrode of the third n-channel field effect transistor N3 as it is, namely, without being inverted. The third p-channel field effect transistor P3 and the third n-channel field effect transistor N3 are concurrently turned on or off by the control signal SC in accordance with whether a pre-emphasis step is to be carried out or not.

Hereinbelow is explained an operation of the output buffer circuit in accordance with the second embodiment.

When the control signal SC having a logical value of 1 is input to the output buffer circuit through the control input terminal TS, the third p-channel field effect transistor P3 and the third n-channel field effect transistor N3 are both turned on. As a result, the tri-state type buffer B20 is rendered enabled, and accordingly, the tri-state type buffer B20 operates in the same manner as the second buffer B2 in the first embodiment. Accordingly, the output buffer circuit in accordance with the second embodiment operates in the same way as the output buffer circuit in accordance with the first embodiment.

In the second embodiment, the on-resistance Rp 2 in the first embodiment corresponds to a sum of the on-resistance Rp 2 of the second p-channel field effect transistor P2 and the on-resistance Rp 3 of the third p-channel field effect transistor P3. Similarly, the on-resistance Rn 2 in the first embodiment corresponds to a sum of the on-resistance Rn 2 of the second n-channel field effect transistor N2 and the on-resistance Rn 3 of the third p-channel field effect transistor N3.

When the control signal SC having a logical value of 0 is input into the output buffer circuit through the control input terminal TS, the second p-channel field effect transistor P2 and the second n-channel field effect transistor N2 are electrically separated from the higher voltage source VDD and the lower voltage source VSS, and hence, output sections of the transistors P2 and N2 are in a condition of high impedance.

Accordingly, viewing from the first p-channel field effect transistor P1 and the first n-channel field effect transistor N1, the second p-channel field effect transistor P2 and the second n-channel field effect transistor N2 in the tri-state type buffer B20 act merely as capacitive loads. Hence, neither the pre-emphasis step nor the de-emphasis step is carried out to a waveform of a logic signal transmitted from the first buffer B1. That is, the pre-emphasis function is in a disabled condition.

As mentioned above, in the second embodiment, when a signal is much attenuated on the transmission line L, and hence, a pre-emphasis step is necessary to be carried out, the control signal SC is designed to have a logical value of 1 for enabling the pre-emphasis function, whereas when a signal is attenuated on the transmission lien L not so much, and hence, a pre-emphasis step is not necessary to be carried out, the control signal SC is designed to have a logical value of 0 for disabling a pre-emphasis function. Thus, the output buffer circuit solely can deal with a case where a signal is much attenuated and a case where a signal is attenuated not so much.

When a transmission line in which a signal is attenuated just slightly is to be driven, it is important to suppress signal reflection caused by discontinuity of the transmission line. The second embodiment can suppress signal reflection by matching both the on-resistance Rp 1 of the first p-channel field effect transistor P1 and the on-resistance Rn 1 of the first n-channel field effect transistor N1 to the characteristic impedance of the transmission line L. By doing so, since the second p-channel field effect transistor P2 and the second n-channel field effect transistor N2 act as capacitive loads, as mentioned earlier, the transistors P2 and N2 would reduce a through rate of an output waveform. This ensures that signal reflection is further suppressed.

When a semiconductor integrated circuit (LSI) including the output buffer circuit in accordance with the second embodiment is under test, it would be possible to interrupt a leakage current in the output buffer circuit by disabling the pre-emphasis function. This ensures that a current leakage test (IDDQ) which is one of test items in a semiconductor integrated circuit test can be conducted.

In the output buffer circuit in accordance with the second embodiment, the transmission line L may be terminated in accordance with the venin's theorem, as shown in FIG. 4, similarly to the first embodiment.

[Third Embodiment]

Figure 6:
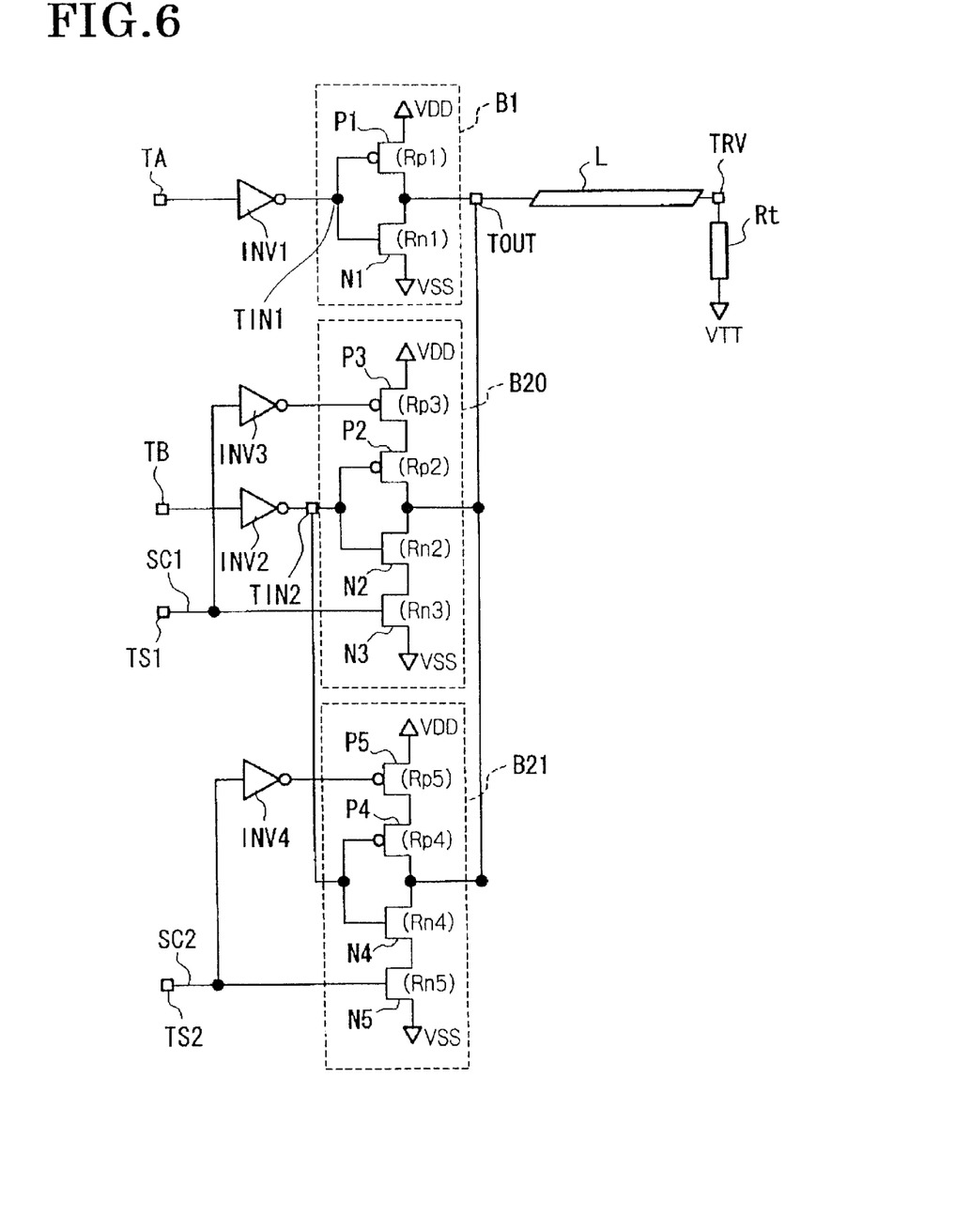
FIG. 6 is a circuit diagram of the output buffer circuit in accordance with the third embodiment of the present invention.

FIG. 6 is a circuit diagram of the output buffer circuit in accordance with the third embodiment.

In comparison with the output buffer circuit in accordance with the second embodiment, illustrated in FIG. 5, the output buffer circuit in accordance with the third embodiment further includes a second tri-state type buffer B21 and a fourth inverter INV 4. In other words, in comparison with the output buffer circuit in accordance with the first embodiment, illustrated in FIG. 2, the output buffer circuit in accordance with the third embodiment, illustrated in FIG. 6, is designed to include first and second tri-state type buffers B20 and B21 in place of the second buffer B2, and additionally include the fourth inverter INV 4. The first and second tri-state type buffers B20 and B21 are activated or inactivated in accordance with whether a pre-emphasis step is to be carried out or not.

In the third embodiment, the second tri-state type buffer B21 is designed to have a driving capacity equal to about a half of a driving capacity of the first tri-state type buffer B20. The first and second tri-state type buffers B20 and B21 are activated or inactivated in accordance with attenuation in a signal in the transmission line L.

The first to third inverters INV 1 to INV 3, the first buffer B1, the first tri-state type buffer B20, the transmission line L and the terminating resistor Rt have the same structure as those in the second embodiment, illustrated in FIG. 5. In the third embodiment, the control input terminal TS in the second embodiment is referred to as a first control input terminal TS1, and the control signal SC in the second embodiment is referred to as a first control signal SC1.

With reference to FIG. 6, the second tri-state type buffer B21 is designed to have the same structure as that of the tri-state type buffer B20 illustrated in FIG. 5. Specifically, the second tri-state type buffer B21 is designed to be comprised of a fourth p-channel field effect transistor P4, a fifth p-channel field effect transistor P5, a fourth n-channel field effect transistor N4, and a fifth n-channel field effect transistor N5. The transistors P4, P5, N4 and N5 have current paths between the higher voltage source VDD and the lower voltage source VSS.

The fourth p-channel field effect transistor P4 has a current path between the higher voltage source VDD and the output terminal TOUT, and has a gate electrode electrically connected to the second input terminal TIN 2. The fourth n-channel field effect transistor N4 has a current path between the lower voltage source VSS and the output terminal TOUT, and has a gate electrode electrically connected to the second input terminal TIN 2.

The fifth p-channel field effect transistor P5 has a current path between the higher voltage source VDD and the current path of the fourth p-channel field effect transistor P4. The fifth n-channel field effect transistor N5 has a current path between the lower voltage source VSS and the current path of the fourth n-channel field effect transistor N4.

The first p-channel field effect transistor P1 is designed to have a driving capacity higher than a sum of a driving capacity of a series circuit defined by the second n-channel field effect transistor N2 and the third n-channel field effect transistor N3 and a driving capacity of a series circuit defined by the fourth n-channel field effect transistor N4 and the fifth n-channel field effect transistor N5, and the first n-channel field effect transistor N1 is designed to have a driving capacity higher than a sum of a driving capacity of a series circuit defined by the second p-channel field effect transistor P2 and the third p-channel field effect transistor P3, and a driving capacity of a series circuit defined by the fourth p-channel field effect transistor P4 and the fifth p-channel field effect transistor P5.

A second control signal SC2 input through a second control input terminal TS2 is inverted in the fourth inverter INV 4, and the thus inverted control signal is input into a gate electrode of the fifth p-channel field effect transistor P5. The second control signal SC2 is input into a gate electrode of the fifth n-channel field effect transistor N5 as it is, namely, without being inverted. The fifth p-channel field effect transistor P5 and the fifth n-channel field effect transistor N5 are concurrently turned on or off by the second control signal SC2 in accordance with whether a pre-emphasis step is to be carried out or not.

Hereinbelow is explained an operation of the output buffer circuit in accordance with the third embodiment.

In the third embodiment, by combining logical values of logic signals input through the first and second control input terminals TS1 and TS2, to each other, it is possible to select an optimal one among four different emphasis including zero emphasis, in accordance with attenuation in a signal in the transmission line L, as follows.

When a logic signal having a logical value of 1 is input through the first control input terminal TS1 and a logic signal having a logical value of 1 is input through the second control input terminal TS2, the emphasis functions in both the first and second tri-state type buffers B20 and B21 are enabled, resulting in that maximum emphasis is obtained.

In contrast, when a logic signal having a logical value of 0 is input through the first control input terminal TS1 and a logic signal having a logical value of 0 is input through the second control input terminal TS2, the emphasis functions in both the first and second tri-state type buffers B20 and B21 are disabled.

When a logic signal having a logical value of 1 is input through one of the first control input terminal TS1 and the second control input terminal TS2, and a logic signal having a logical value of 0 is input through the other, intermediate emphasis is obtained.

Herein, if weighting is made in binary between a gate width Wp2 of the second p-channel field effect transistor P2 and a gate width Wp4 of the fourth p-channel field effect transistor P4 and between a gate width Wn2 of the second n-channel field effect transistor N2 and a gate width Wn4 of the fourth n-channel field effect transistor N4, it would be possible to optimal mode among four different operation modes including zero emphasis mode, low emphasis mode, intermediate emphasis mode and high emphasis mode, by applying a binary code to the first and second control input terminals TS1 and TS2. The first tri-state type buffer B20 is activated or inactivated in accordance with MSB data represented with two-bit binary code and indicative of pre-emphasis, and the second tri-state type buffer B21 is activated or inactivated in accordance with LSB data represented with two-bit binary code.

Though the output buffer circuit in accordance with the third embodiment is designed to include two tri-state type buffers B20 and B21, the output buffer circuit may be designed to include N tri-state type buffers where N is an integer equal to or greater than 3, in which case, the pre-emphasis is controlled by n-bit binary codes.

The tri-state type buffer may be controlled such that the pre-emphasis is minimized when tested. This ensures that a current running through the tri-state type buffer can be reduced, and accordingly, a current leakage test can be conducted with high accuracy, for instance.

In the output buffer circuit in accordance with the third embodiment, the transmission line L may be terminated in accordance with the venin's theorem, as shown in FIG. 4, similarly to the first embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

For instance, two p-channel field effect transistors and two n-channel field effect transistors are electrically connected in series to one another between the higher voltage source VDD and the lower voltage source VSS to thereby accomplish tri-state function in the second and third embodiments. Instead, an output signal of NAND gate may be input into a gate electrode of the p-channel field effect transistors and an output signal of NOR gate may be input into a gate electrode of the n-channel field effect transistors, in which case, the p-channel and n-channel field effect transistors are complementarily turned on in accordance with input signals when enabled, whereas those transistors are both turned off when disabled.

The entire disclosure of Japanese Patent Application No. 2000-280559 filed on Sep. 14, 2000 including specification, claims, drawings and summary is incorporated herein by reference in its entirety.

What is claimed is:

1. An output buffer circuit having a function of accomplishing pre-emphasis, and transmitting a logic signal to a transmission line acting as a distributed parameter circuit, comprising:
   (a) a first buffer which receives a first logic signal defining a logical value of a logic signal to be transmitted to said transmission line, and drives said transmission line; and
   (b) a second buffer which receives a second logic signal having a predetermined logical relation with said first logic signal, and cooperates with said first buffer to drive said transmission line,
   wherein said second buffer is activated in accordance with whether a pre-emphasis step is to be carried out or not,
   wherein said second buffer has an output impedance higher than an output impedance of said first buffer.
   said first buffer is comprised of (a1) a first p-channel field effect transistor having a current path between a higher voltage source of two voltage sources and an ouput terminal, and having a gate electrode electrically connected to a first input terminal, and (a2) a first n-channel field effect transistor having a current path between a lower voltage source of said two voltage sources and said output terminal, and having a gate electrode electrically connected to said first input terminal,
   said second buffer is comprised of (b1) a second p-channel field effect transistor having a current path between said higher voltage source and said output terminal, and having a gate electrode electrically connected to a second input terminal, and (b2) a second n-channel field effect transistor having a current path between said lower voltage source and said output terminal, and having a gate electrode electrically connected to said second input terminal,
   said first p-channel field effect transistor has a driving capacity higher than a driving capacity of said second n-channel field effect transistor, and
   said first n-channel field effect transistor has a driving capacity higher than a driving capacity of said second p-channel field effect transistor, and
   wherein said second buffer is comprised of one or more tri-state type buffer(s).

2. The output buffer as set forth in claim 1, wherein said second buffer is activated when a logic signal in said transmission line is attenuated to a first degree and hence a pre-emphasis step is to be carried out, and is inactivated when said logic signal is attenuated to a second degree that is less than the first degree and hence a pre-emphasis step is not to be carried out.

3. The output buffer as set forth in claim 1, wherein said second buffer is inactivated while a test is being conducted.

4. An output buffer circuit having a function of accomplishing pre-emphasis, and transmitting a logic signal to a transmission line acting a distributed parameter circuit, comprising:
   (a) a first buffer which receives a first logic signal defining a logical value of a logic signal to be transmitted to said transmission line, and drives said transmission line; and
   (b) a second buffer which receives a second logic signal having a predetermined logical relation with said first logic signal, and cooperates with said first buffer to drive said transmission line,
   wherein said second buffer has an output impedance higher than an output impedance of said first buffer, said first buffer is comprised of (a1) a first p-channel field effect transistor having a current path between a higher voltage source of two voltage sources and an output terminal, and having a gate electrode electrically connected to a first input terminal, and (a2) a first n-channel field effect transistor having a current path between a lower voltage source of said two voltage sources and said output terminal, and having a gate electrode electrically connected to said first input terminal, said second buffer is comprised of a tri-state type buffer including (b1) a second p-channel field effect transistor having a current path between said higher voltage source and said output terminal, and having a gate electrode electrically connected to a second input terminal, (b2) a second n-channel field effect transistor having a current path between said lower voltage source and said output terminal, and having a gate electrode electrically connected to said second input terminal, (b3) a third p-channel field effect transistor electrically connected in series with said second p-channel field effect transistor, and turned on or off in accordance with whether a pre-emphasis step is to be carried out or not, and (b4) a third n-channel field effect transistor electrically connected in series with said second n-channel field effect transistor, and turned on or off simultaneously with said third p-channel field effect transistor, said first p-channel field effect transistor having a driving capacity higher than a sum of driving capacities of said second and third n-channel field effect transistors, and said first n-channel field effect transistor having a driving capacity higher than a sum of driving capacities of said second and third p-channel field effect transistors.

5. The output buffer as set forth in claim 4, wherein said second logic signal has a logical value different from a logical value of a logic signal transmitted from said first buffer immediately before said first logic signal is transited, at latest when said first logic signal is transited.

6. The output buffer as set forth in claim 4, wherein said transmission line is terminated with a terminated resistor electrically connected to a terminating voltage source.

7. The output buffer as set forth in claim 4, wherein said transmission line is terminated with a first terminated resistor electrically connected to said higher voltage source, and a second terminated resistor electrically connected to said lower voltage source.

8. The output buffer as set forth in claim 4, wherein an output impedance of said first buffer is matched to a characteristic impedance of said transmission line.

9. The output buffer as set forth in claim 4, wherein said second buffer is activated when a logic signal in said transmission line is attenuated in a higher degree and hence a pre-emphasis step is to be carried out, and is inactivated when said logic signal is attenuated in a lower degree and hence a pre-emphasis step is not to be carried out.

10. The output buffer as set forth in claim 4, wherein said second buffer is inactivated while a test is being conducted.

11. An output buffer circuit having a function of accomplishing pre-emphasis, and transmitting a logic signal to a transmission line acting as a distributed parameter circuit, comprising:

(a) a first buffer which receives a first logic signal defining a logical value of a logic signal to be transmitted to said transmission line, and drives said transmission line; and (b) a second buffer which receives a second logic signal having a predetermined logical relation with said first logic signal, and cooperates with said first buffer to drive said transmission line, wherein said second buffer has an output impedance higher than an output impedance of said first buffer, said first buffer is comprised of (a1) a first p-channel field effect transistor having a current path between a higher voltage source of two voltage sources and an output terminal, and having a gate electrode electrically connected to a first input terminal, and (a2) a first n-channel field effect transistor having a current path between a lower voltage source of said two voltage sources and said output terminal, and having a gate electrode electrically connected to said first input terminal, said second buffer is comprises of first to N-th tri-state type buffers each including (b1) a second p-channel field effect transistor having a current path between said higher voltage source and said output terminal, and having a gate electrode electrically connected to a second input terminal, (b2) a second n-channel field effect transistor having a current path between said lower voltage source and said output terminal, and having a gate electrode electrically connected to said second input terminal, (b3) a third p-channel field effect transistor electrically connected in series with said second p-channel field effect transistor, and turned on or off in accordance with whether a pre-emphasis step is to be carried out or not, and (b4) a third n-channel field effect transistor electrically connected in series with said second n-channel field effect transistor, and turned on or off simultaneously with said third p-channel field effect transistor, wherein N is an integer equal to or greater than 2, said first p-channel field effect transistor has a driving capacity higher than a sum of driving capacities of said second and third n-channel field effect transistors in said first to N-th tri-state type buffers, and said first n-channel field effect transistor has a driving capacity higher than a sum of driving capacities of said second and third p-channel field effect transistors in said first to N-th tri-state type buffers.

12. The output buffer as set forth in claim 11, wherein said second logic signal has a logical value different from a logical value of a logic signal transmitted from said first buffer immediately before said first logic signal is transited, at latest when said first logic signal is transited.

13. The output buffer as set forth in claim 11, wherein said transmission line is terminated with a terminated resistor electrically connected to a terminating voltage source.

14. The output buffer as set forth in claim 11, wherein said transmission line is terminated with a first terminated resistor electrically connected to said higher voltage source, and a second terminated resistor electrically connected to said lower voltage source.

15. The output buffer as set forth in claim 11, wherein an output impedance of said first buffer is matched to a characteristic impedance of said transmission line.

16. The output buffer as set forth in claim 11, wherein said second buffer is activated when a logic signal in said transmission line is attenuated to a first degree and hence a pre-emphasis step is to be carried out, and is inactivated when said logic signal is attenuated to a second degree that is less than the first degree and hence a pre-emphasis step is not to be carried out.

17. The output buffer as set forth in claim 11, wherein said second buffer is inactivated while a test is being conducted.

18. The output buffer as set forth in claim 11, wherein a M-th tri-state type buffer has a driving capacity equal to about a half of a driving capacity of a (M−1)-th tri-state type buffer, wherein M is an integer equal to or smaller than N.

19. The output buffer as set forth in claim 11, wherein said first to N-th tri-state type buffers are activated or inactivated in accordance with a binary code indicating pre-emphasis.

20. The output buffer as set forth in claim 11, wherein said first to N-th tri-state type buffers are activated or inactivated in accordance with attenuation of said transmission line.

21. The output buffer as set forth in claim 11, wherein said second buffer is activated such that pre-emphasis is minimized in a test.

* * * * *